(12) United States Patent
Shigematsu

(10) Patent No.: US 10,121,672 B2
(45) Date of Patent: Nov. 6, 2018

(54) CUTTING METHOD FOR CUTTING PROCESSING-TARGET OBJECT AND CUTTING APPARATUS THAT CUTS PROCESSING-TARGET OBJECT

(71) Applicant: DISCO CORPORATION, Tokyo (JP)

(72) Inventor: Koichi Shigematsu, Tokyo (JP)

(73) Assignee: Disco Corporation, Tokyo (JP)

( * ) Notice: Subject to any disclaimer, the term of this patent is extended or adjusted under 35 U.S.C. 154(b) by 35 days.

(21) Appl. No.: 15/621,165

(22) Filed: Jun. 13, 2017

(65) Prior Publication Data

US 2017/0372908 A1 Dec. 28, 2017

(30) Foreign Application Priority Data

Jun. 22, 2016 (JP) .................. 2016-123811

(51) Int. Cl.
| | |
|---|---|
| *H01L 21/822* | (2006.01) |
| *H01L 21/304* | (2006.01) |
| *H01L 21/683* | (2006.01) |
| *B28D 5/02* | (2006.01) |
| *H01L 21/78* | (2006.01) |
| *H01L 21/67* | (2006.01) |
| *H01L 21/268* | (2006.01) |

(52) U.S. Cl.
CPC .......... *H01L 21/3043* (2013.01); *B28D 5/022* (2013.01); *H01L 21/67092* (2013.01); *H01L 21/67288* (2013.01); *H01L 21/6836* (2013.01); *H01L 21/78* (2013.01); *H01L 21/822* (2013.01); *H01L 21/2683* (2013.01); *H01L 2933/0033* (2013.01)

(58) Field of Classification Search
CPC ................. H01L 21/3043; H01L 21/6836
See application file for complete search history.

(56) References Cited

U.S. PATENT DOCUMENTS

2011/0294279 A1* 12/2011 Okamura ............. B28D 5/0011
438/460
2015/0027227 A1* 1/2015 Masada .................. G01N 29/07
73/598

FOREIGN PATENT DOCUMENTS

JP 09-199451 7/1997

* cited by examiner

*Primary Examiner* — Mohammad Choudhry
(74) *Attorney, Agent, or Firm* — Greer Burns & Crain, Ltd.

(57) ABSTRACT

There is provided a cutting method for cutting a processing-target object by a cutting blade. The cutting method includes a holding step of holding the processing-target object by a holding table and a cutting step of cutting the processing-target object by the cutting blade by causing the cutting blade that rotates to cut into the processing-target object held by the holding table and causing the holding table and the cutting blade to relatively move after the holding step is carried out. In the cutting step, cutting is carried out with detection of whether or not a crack in the processing-target object exists by a crack detecting unit disposed on the rear side relative to the cutting blade in a cutting progression direction in which cutting processing of the processing-target object by the cutting blade progresses.

13 Claims, 4 Drawing Sheets

CUTTING METHOD FOR CUTTING PROCESSING-TARGET OBJECT AND CUTTING APPARATUS THAT CUTS PROCESSING-TARGET OBJECT

BACKGROUND OF THE INVENTION

Field of the Invention

The present invention relates to a cutting method for cutting a processing-target object and a cutting apparatus that cuts a processing-target object.

Description of the Related Art

In a manufacturing processing of device chips, planned dividing lines in a lattice manner called streets are set in the front surfaces of wafers composed of silicon or a compound semiconductor and devices such as integrated circuit (IC) and large-scale integration (LSI) are formed in the respective regions marked out by these planned dividing lines. These wafers are cut and divided along the planned dividing lines and individual device chips are fabricated.

After the end of the dividing of the wafer, a test to check whether damage such as a chip or a crack does not exist in the formed individual device chips is carried out (for example, refer to Japanese Patent Laid-open No. 1997-199451). For example, if a crack has been generated in the device chip, this device chip is determined to be a defective product. Such a device chip cannot be shipped because the device does not correctly operate.

SUMMARY OF THE INVENTION

In a step of cutting a processing-target object such as a semiconductor wafer, a crack is often generated in this step if the kind of cutting blade or the processing condition is not proper. Furthermore, even when cutting can be carried out without generation of a crack in the processing-target object at the start of the cutting step, the state of the cutting blade changes along with progression of the cutting processing and a crack is generated in the processing-target object in some cases.

If the cutting processing is continued without change for the processing-target object in which a crack has been generated, this crack is extended. Furthermore, if the cutting processing is carried out without change under the condition under which a crack is generated, the possibility of generation of a new crack is also high. At any rate, if the cutting processing is continued in such a state, cracks become distributed over a wide range in the processing-target object.

If the semiconductor wafer in which cracks are distributed over a wide range is cut and divided, cracks are included in many of the obtained device chips and thus the percent defective of the device chips is high. For this reason, if a crack is generated in cutting processing, the cutting processing should be stopped and the processing condition and so forth should be reviewed. However, if the generation of this crack cannot be detected, the stopping or the like of the cutting processing is also impossible.

The present invention is made in view of such a problem and an object thereof is to provide a cutting method that can suppress the generation rate of defective products of device chips to the minimum and a cutting apparatus suitable to carry out this cutting method.

In accordance with an aspect of the present invention, there is provided a cutting method for cutting a processing-target object by a cutting blade. The cutting method includes a holding step of holding the processing-target object by a holding table and a cutting step of cutting the processing-target object by the cutting blade by causing the cutting blade that rotates to cut into the processing-target object held by the holding table and causing the holding table and the cutting blade to relatively move after the holding step is carried out. In the cutting step, cutting is carried out with detection of whether or not a crack in the processing-target object exists by a crack detecting unit disposed on the rear side relative to the cutting blade in a cutting progression direction in which cutting processing of the processing-target object by the cutting blade progresses.

In the aspect of the present invention, relative movement between the holding table and the cutting blade may be stopped or the speed of the relative movement may be decreased when a crack in the processing-target object is detected by the crack detecting unit in execution of the cutting step.

Furthermore, in accordance with another aspect of the present invention, there is provided a cutting apparatus that cuts a processing-target object. The cutting apparatus includes a holding table that holds the processing-target object, cutting means having a cutting blade that cuts the processing-target object held by the holding table, moving means that causes the cutting blade and the holding table to relatively move, and crack detecting unit that is disposed on the rear side relative to the cutting blade in a cutting progression direction in which cutting processing of the processing-target object by the cutting blade progresses, and detects whether or not a crack in the processing-target object exists.

According to the present invention, the processing-target object is cut with detection of whether or not a crack exists by the crack detecting unit disposed on the rear side relative to the cutting blade in the cutting progression direction (processing-feed direction). In this case, when a crack is generated in the cutting processing, immediately this crack is detected.

If a crack is detected, immediately the cutting processing may be stopped. Alternatively, the cutting processing may be continued after change to a processing condition under which a crack is not generated in the processing-target object through decreasing the cutting-feed rate or changing the rotational speed of the cutting blade or the like. This can complete the cutting processing without generation of a new crack and without the extension of an existing crack.

Furthermore, if the crack detecting unit detects generation of a crack, the cutting apparatus may store information relating to the generation position of the crack. Thereafter, if a device chip at this position is determined to be a defective product based on this information when the wafer is divided and device chips are picked up, a step of determining whether or not these device chips are good can be omitted.

Therefore, by the present invention, a cutting method that can suppress the generation rate of defective products of device chips to the minimum and a cutting apparatus suitable to carry out this cutting method are provided.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment according to the present invention will be described. In a cutting method according to the present embodiment, first a holding step of holding a processing-target object by a holding table is carried out. After this holding step is carried out, a cutting step is carried out. In this cutting step, a cutting blade is caused to cut into the processing-target object and the holding table and the cutting blade are relatively moved to cut the processing-target object. The cutting step is carried out with detection of whether or not a crack in the processing-target object exists by a crack detecting unit (crack detecting means). This crack detecting unit (crack detecting means) is disposed on the rear side relative to the cutting blade in the cutting progression direction (processing-feed direction). If this crack detecting unit detects a crack in the processing-target object, the relative speed between the holding table and the cutting blade is decreased or both are relatively stopped. In this case, the cutting processing is not continued under the condition under which a crack is generated in the processing-target object. Therefore, the generation of the crack is minimized and the number of device chips as defective products is suppressed.

Figure 1:
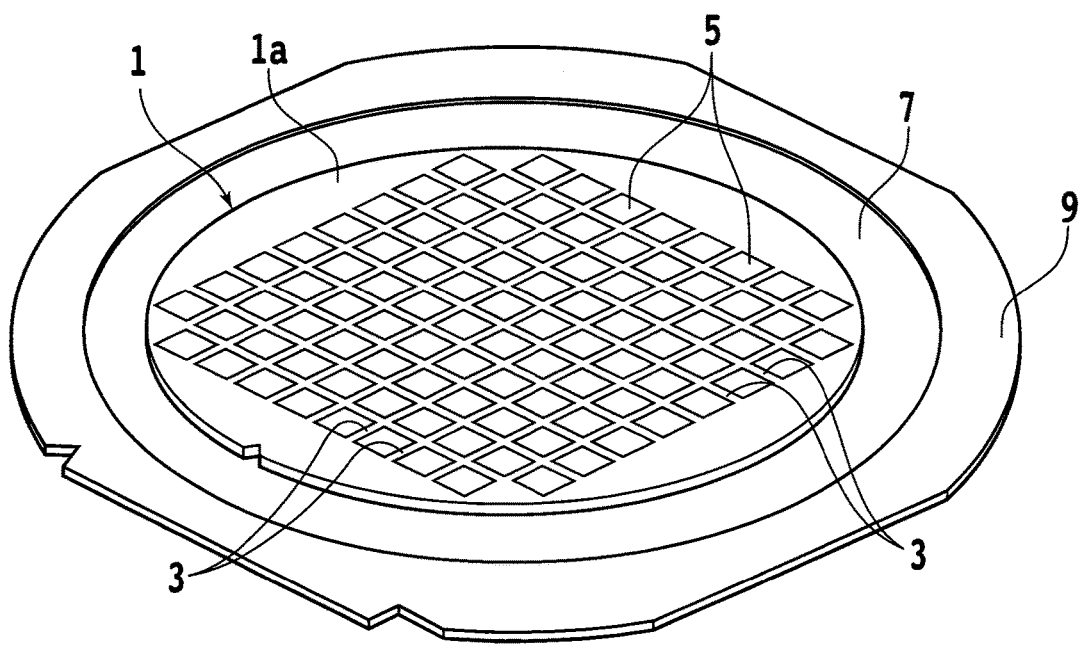
FIG. 1 is a perspective view schematically showing a processing-target object.

Next, the processing-target object of the cutting method according to the present embodiment will be described. For example, this processing-target object is a wafer that is composed of a material such as silicon, sapphire, silicon carbide (SiC), or another compound semiconductor and has a substantially circular disc shape or a substrate of sapphire, glass, quartz, or the like. FIG. 1 is a perspective view schematically showing one example of this processing-target object. As shown in FIG. 1, a front surface 1a of a processing-target object 1 is segmented into plural regions by planned dividing lines 3 arranged in a lattice manner and a device 5 such as an IC is formed in each region. The processing-target object 1 is finally cut along the planned dividing lines 3 to be divided into individual device chips by the cutting method according to the present embodiment. The processing-target object 1 is treated after being stuck onto a dicing tape 7 whose outer circumferential part is fixed by a frame 9. When the processing-target object 1 is treated through the dicing tape 7 and the frame 9, the load and so forth received in conveyance of the processing-target object 1 are alleviated and the occurrence of damage such as a crack is prevented. Furthermore, after the end of the cutting step, the device chips can be easily picked up by expanding the dicing tape 7.

Figure 2:
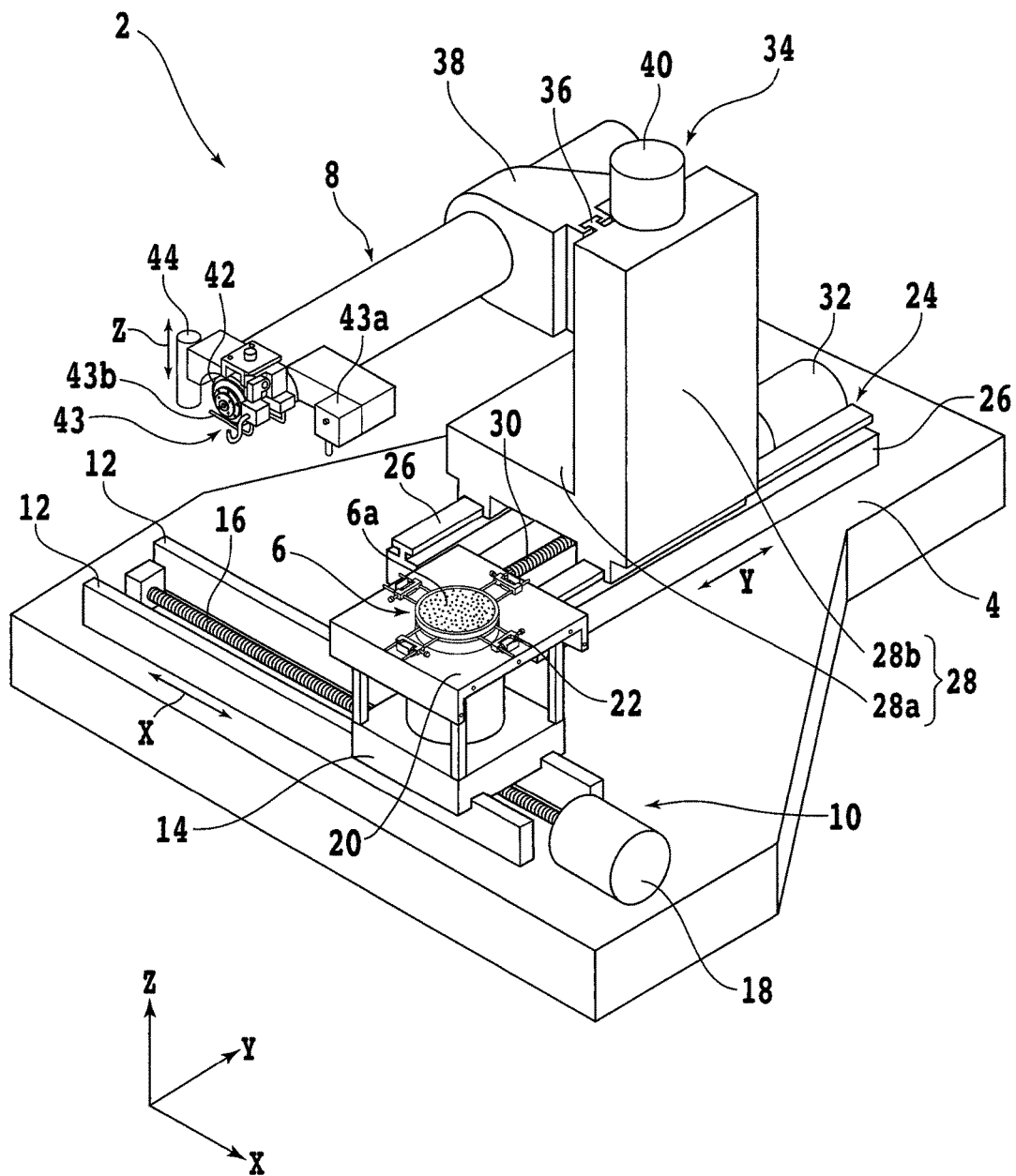
FIG. 2 is a perspective view schematically showing a cutting apparatus.

Next, a cutting apparatus used for the cutting step of the cutting method according to the present embodiment will be described by using FIG. 2. FIG. 2 is a perspective view schematically showing a configuration example of the cutting apparatus. As shown in FIG. 2, the cutting apparatus 2 includes a pedestal 4 that supports the respective constituent elements.

A holding table (holding means) 6 that holds a processing-target object (not shown) is provided over the upper surface of the pedestal 4. A blade unit (cutting means) 8 that cuts the processing-target object is disposed over the holding table 6. An X-axis movement mechanism (moving means) 10 that moves the holding table 6 in the processing-feed direction (X-axis direction) is provided under the holding table 6. The X-axis movement mechanism 10 includes a pair of X-axis guide rails 12 that are provided on the upper surface of the pedestal 4 and are parallel to the X-axis direction. An X-axis movement table 14 is slidably set on the X-axis guide rails 12. A nut part (not shown) is provided on the back surface side (lower surface side) of the X-axis movement table 14 and an X-axis ball screw 16 parallel to the X-axis guide rails 12 is screwed to this nut part. An X-axis pulse motor 18 is joined to one end part of the X-axis ball screw 16. When the X-axis ball screw 16 is rotated by the X-axis pulse motor 18, the X-axis movement table 14 moves in the X-axis direction along the X-axis guide rails 12.

A support platform 20 is provided on the front surface side (upper surface side) of the X-axis movement table 14. The holding table 6 is disposed at the center of the support platform 20. Four clamps 22 that clamp and fix an annular frame (not shown) that holds the processing-target object from four sides are provided around the holding table 6. The holding table 6 is joined to a rotation mechanism (not shown) provided under the support platform 20 and rotates around a rotation axis parallel to the Z-axis. The front surface of the holding table 6 serves as a holding surface 6a that holds the processing-target object by suction. A negative pressure of a suction source (not shown) acts on this holding surface 6a through a flow path (not shown) formed inside the holding table 6 and a suction force to suck the processing-target object is generated.

A Y-axis movement mechanism (indexing-feed means) 24 that moves the blade unit 8 in the indexing-feed direction (Y-axis direction) is provided adjacent to the X-axis movement mechanism 10. The Y-axis movement mechanism 24 includes a pair of Y-axis guide rails 26 that are provided on the upper surface of the pedestal 4 and are parallel to the Y-axis direction. A Y-axis movement table 28 is slidably set on the Y-axis guide rails 26. The Y-axis movement table 28 includes a base part 28a in contact with the Y-axis guide rails 26 and a wall part 28b provided upright with respect to the base part 28a. A nut part (not shown) is provided on the back surface side (lower surface side) of the base part 28a of the Y-axis movement table 28 and a Y-axis ball screw 30 parallel to the Y-axis guide rails 26 is screwed to this nut part. A Y-axis pulse motor 32 is joined to one end part of the Y-axis ball screw 30. When the Y-axis ball screw 30 is rotated by the Y-axis pulse motor 32, the Y-axis movement table 28 moves in the Y-axis direction along the Y-axis guide rails 26.

A Z-axis movement mechanism 34 that moves the blade unit 8 in the vertical direction (Z-axis direction) is provided on the wall part 28b of the Y-axis movement table 28. The Z-axis movement mechanism 34 includes a pair of Z-axis guide rails 36 that are provided on a side surface of the wall part 28b and are parallel to the Z-axis direction. A Z-axis movement table 38 is slidably set on the Z-axis guide rails 36. A nut part (not shown) is provided on the back surface side of the Z-axis movement table 38 (side of the wall part 28b) and a Z-axis ball screw (not shown) parallel to the Z-axis guide rails 36 is screwed to this nut part. A Z-axis pulse motor 40 is joined to one end part of the Z-axis ball screw. When the Z-axis ball screw is rotated by the Z-axis pulse motor 40, the Z-axis movement table 38 moves in the Z-axis direction along the Z-axis guide rails 36. The blade unit (cutting means) 8, which cuts the processing-target object, is supported by this Z-axis movement table 38.

The blade unit (cutting means) 8 includes a spindle (not shown) that is rotatably supported and a cutting blade 42 that rotates in accordance with the rotation of this spindle. The blade unit 8 can lower the cutting blade 42 that rotates along the Z-axis direction due to actuation of the Z-axis movement mechanism 34 and cause the cutting blade 42 to cut into the processing-target object held by the holding table 6. Then, when the X-axis movement mechanism (moving means) 10 is actuated to cause the holding table (holding means) 6 and the cutting blade 42 to relatively move in the state in which the cutting blade 42 is caused to cut into the processing-target object, the processing-target object is cut.

The blade unit 8 has cutting liquid feed means 43 and an imaging apparatus 43a on the front side relative to the cutting blade 42 in the cutting progression direction (processing-feed direction) in which the cutting processing progresses. The imaging apparatus 43a can image the front surface of the processing-target object 1 and is used when the position of the cutting blade 42 is adjusted to cause the cutting blade 42 to cut the processing-target object 1 along the planned dividing line 3. The cutting liquid feed means 43 has a cutting liquid feed pipe 43b that is connected to a cutting liquid feed source (not shown) and is extended near the cutting blade 42, and can feed a cutting liquid to the front surface 1a of the processing-target object 1 from plural openings made in the side surface of the cutting liquid feed pipe 43b. The blade unit 8 has a crack detecting unit 44 on the rear side relative to the cutting blade 42 in the cutting progression direction (processing-feed direction) in which the cutting processing progresses. The crack detecting unit 44 is supported by the blade unit (cutting means) 8 movably in the Z-axis direction and is brought close to the processing-target object held by the holding table 6 at the time of cutting processing.

Figure 3:
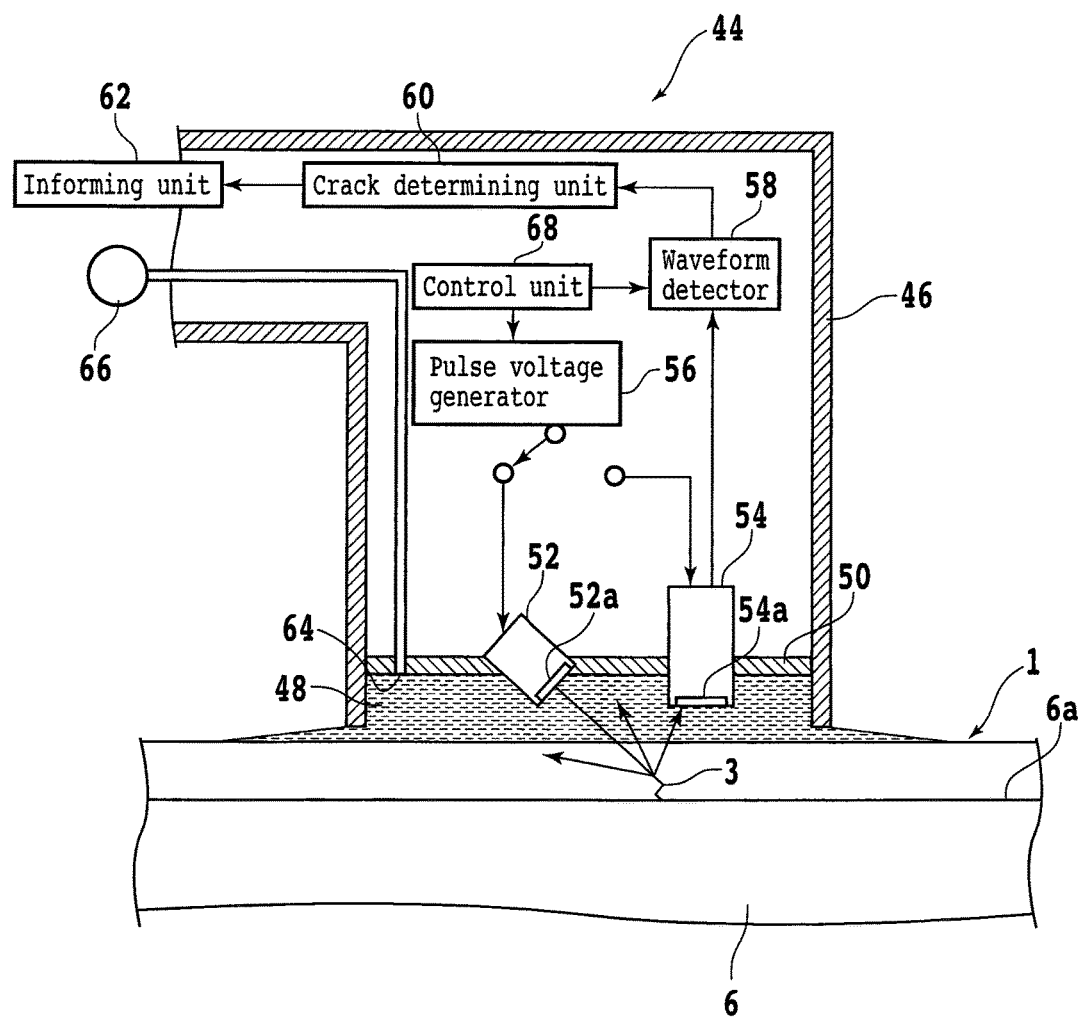
FIG. 3 is a schematic diagram showing the configuration of crack detecting unit.

In FIG. 3, a schematic diagram for explaining the configuration of the crack detecting unit 44 is shown. The crack detecting unit 44 oscillates ultrasonic waves toward the processing-target object 1 and observes reflected waves to detect whether or not a crack exists in the processing-target object 1. As shown in FIG. 3, the crack detecting unit 44 is used with a cylindrical chassis 46 brought close to the processing-target object 1 held on the holding surface 6a of the holding table 6. Furthermore, for example water 48 is supplied to the space between the processing-target object 1 and the crack detecting unit 44 as a propagation medium of ultrasonic waves. At the lower part of the chassis 46, a bottom plate 50 is disposed on the upper side relative to the lower end part of the chassis 46. The space is so formed that the water 48 accumulates between the processing-target object 1 and the bottom plate 50.

The bottom plate 50 is provided with an ultrasonic oscillating unit 52 and an ultrasonic oscillating-receiving unit 54. An ultrasonic vibrator 52a possessed by the ultrasonic oscillating unit 52 and an ultrasonic vibrator 54a possessed by the ultrasonic oscillating-receiving unit 54 are exposed to the side of the processing-target object 1. The ultrasonic oscillating-receiving unit 54 is attached in an orientation that allows the ultrasonic oscillating-receiving unit 54 to oscillate ultrasonic waves perpendicularly to the processing-target object 1, whereas the ultrasonic oscillating unit 52 is so attached as to be capable of oscillating ultrasonic waves to the processing-target object 1 from a direction that is not the perpendicular direction. The ultrasonic oscillating unit 52 and the ultrasonic oscillating-receiving unit 54 are each connected to a pulse voltage generator 56. When this pulse voltage generator 56 applies a pulse voltage to the ultrasonic vibrator 52a, the ultrasonic oscillating unit 52 oscillates first ultrasonic waves toward the processing-target object 1. Furthermore, when the pulse voltage generator 56 applies a pulse voltage to the ultrasonic vibrator 54a, the ultrasonic oscillating-receiving unit 54 oscillates second ultrasonic waves toward the processing-target object 1.

A supply port 64 of water that is the ultrasonic propagation medium is opened in the bottom plate 50 of the chassis 46 of the crack detecting unit 44, and this supply port 64 is connected to a supply source 66 through a supply path in the chassis 46. When water is supplied from the supply source 66 through the supply port 64, the space between the bottom plate 50 and the processing-target object 1 is filled with the water and the ultrasonic vibrator 52a and the ultrasonic vibrator 54a are immersed in the water. This allows the first and second ultrasonic waves to be incident on the processing-target object 1 without the intermediary of the air. The first and second ultrasonic waves repeat reflection inside the processing-target object 1 and are observed as reflected waves by the ultrasonic oscillating-receiving unit 54. When the reflected waves of the first ultrasonic waves or the reflected waves of the second ultrasonic waves enter the ultrasonic oscillating-receiving unit 54, these reflected waves are converted to an electrical signal to be transmitted to a waveform detector 58. The waveform detector 58 has a filter and so forth and removes noise from the transmitted electrical signal to create waveform information of the reflected waves. Then, the waveform detector 58 transmits the waveform information and so forth to a crack determining unit 60.

The crack determining unit 60 determines whether or not a crack in the processing-target object 1 exists based on whether or not diffused reflection included in the waveform information of the reflected waves of the first ultrasonic waves or the reflected waves of the second ultrasonic waves exists, and outputs the determination result to an informing unit 62. If the determination result indicating that a crack has been generated is input, the informing unit 62 informs the user of the cutting apparatus 2 of the generation of the crack in the processing-target object 1. Then, the informing unit 62 transmits information relating to the crack to control equipment of the cutting apparatus 2 and prompts change in the processing condition and so forth. Here, depending on the shape, size, orientation, and so forth of the crack, diffused reflection attributed to this crack is not sufficiently reflected in the reflected waves of the first ultrasonic waves in some cases. Therefore, in the present embodiment, the crack determining unit 60 determines whether or not a crack exists by analyzing the waveform information of the reflected waves of the second ultrasonic waves oscillated at a different angle from the first ultrasonic waves in conjunction with the waveform information of the reflected waves of the first ultrasonic waves. A control unit 68 controls the pulse voltage generator 56 in such a manner that the two kinds of ultrasonic waves are alternately oscillated and causes the waveform detector 58 to detect the waveform of the respective reflected waves to enable detection of all sorts of cracks.

Figure 4A:
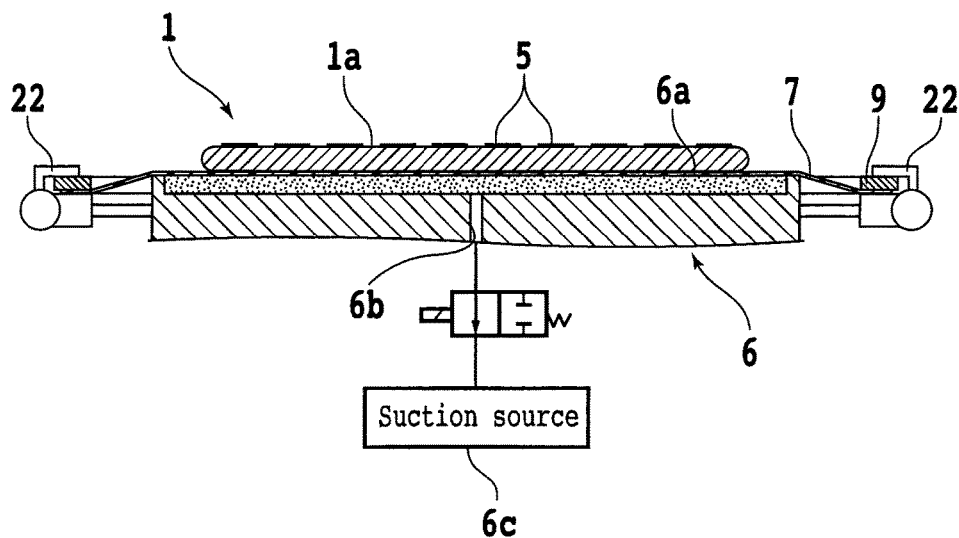
FIG. 4A is a sectional view schematically showing a holding step in a cutting method.

Next, each step of the cutting method according to the present embodiment will be described. First, the holding step of holding the processing-target object by the holding table will be described by using FIG. 4A. FIG. 4A is a sectional schematic diagram for explaining the holding step. In the holding step, first the processing-target object 1 stuck onto the dicing tape 7 is placed on the holding surface 6a of the holding table 6 of the cutting apparatus 2, and the frame 9 that holds this dicing tape 7 is clamped by the clamps 22 of the holding table 6. Then, a negative pressure acts from a suction source 6c through a flow path 6b formed inside the holding table 6 and the processing-target object 1 is held on the holding surface 6a by suction. From then on, the processing-target object 1 continues to be held on the holding surface 6a by suction until the cutting step is completed.

Figure 4B:
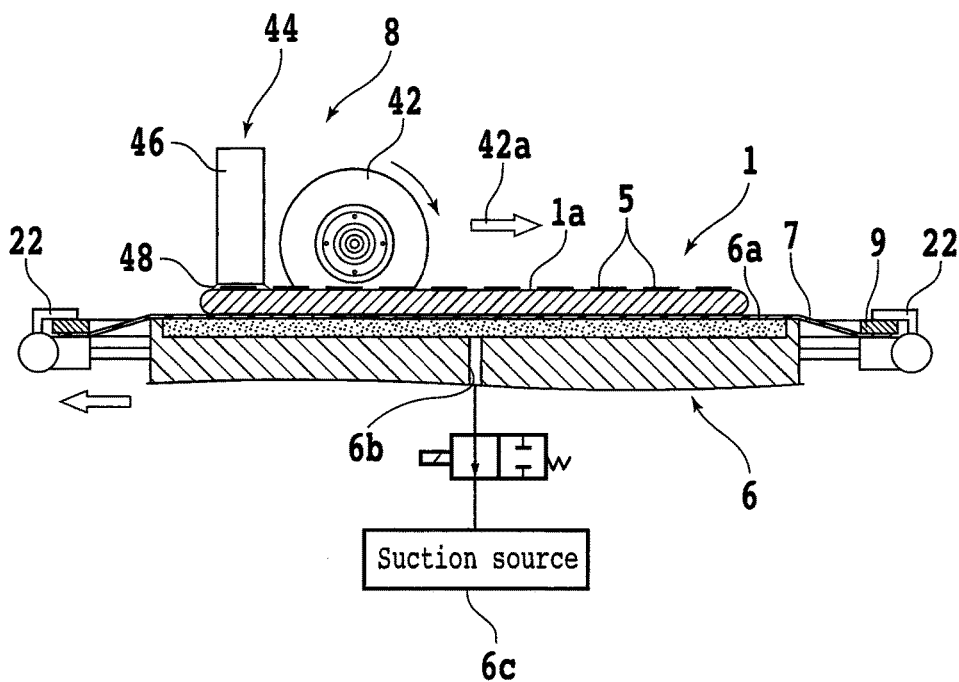
FIG. 4B is a sectional view schematically showing a cutting step in the cutting method.

Next, the cutting step in the cutting method according to the present embodiment will be described by using FIG. 4B. FIG. 4B is a sectional schematic diagram for explaining the cutting step. In the cutting step, first the cutting blade 42 of the blade unit (cutting means) 8 of the cutting apparatus 2 is rotated. Next, the Z-axis movement mechanism is actuated to lower the cutting blade 42 that rotates along the Z-axis and cause the cutting blade 42 to cut into the processing-target object 1 held by the holding table 6 from the planned dividing line. Then, the X-axis movement mechanism (moving means) is actuated to cause the holding table 6 and the cutting blade 42 to relatively move. Thereupon, the cutting blade 42 is sent along the planned dividing line and the processing-target object 1 is subjected to cutting processing. The blade unit 8 has the crack detecting unit 44 disposed on the rear side relative to the cutting blade 42 in a cutting progression direction (processing-feed direction) 42a in which the cutting processing progresses. The crack detecting unit 44 detects whether or not a crack of the processing-target object 1 in the cut region exists.

When the cutting processing is started and the cutting blade 42 cuts into the vicinity of an end part of the processing-target object 1, the crack detecting unit 44 is before being operated and is located at a higher position than in operation. When the cutting processing progresses and the crack detecting unit 44 reaches the upper side of the processing-target object 1, the crack detecting unit 44 is brought close to the front surface 1a across a predetermined distance and water that is the ultrasonic propagation medium is supplied from the supply port made in the bottom plate of the chassis. Then, the space surrounded by the chassis of the crack detecting unit 44, the bottom plate, and the front surface 1a of the processing-target object is filled with the water and the operation of the crack detecting unit 44 is started.

First, ultrasonic waves are oscillated from the ultrasonic vibrators of the crack detecting unit 44 to the processing-target object 1. These ultrasonic waves repeat reflection in the processing-target object 1 and are received as reflected waves by the ultrasonic oscillating-receiving unit of the crack detecting unit 44. The crack detecting unit 44 analyzes the waveform of these reflected waves and detects whether or not a crack inside the processing-target object 1 exists. The cutting processing in the cutting step is advanced with repetition of the detection of a crack by the crack detecting unit 44. The cutting processing is advanced without change while the crack detecting unit 44 does not detect a crack inside the processing-target object 1. When the crack detecting unit 44 detects a crack in the processing-target object 1, e.g. the cutting condition is changed as appropriate according to the situation of the crack. The cutting condition is changed to one under which a crack is not generated through decreasing the rotational speed of the cutting blade 42 or decreasing the cutting progression speed (processing-feed rate) or the like. In this case, this crack does not extend due to the cutting processing and a new crack is not generated. Furthermore, when a crack is detected, the cutting progression speed may be set to zero to suspend the cutting, and the crack detecting unit 44 may inform the detection of the crack and the cutting apparatus may be shifted to the standby state in which the cutting apparatus waits for input of an instruction. Because generally the crack is not constant in the length, direction, and so forth, the cutting processing may be resumed after the user of the cutting apparatus 2 well determines the situation of the crack and properly changes the cutting condition.

According to the cutting method in accordance with the present embodiment, when a crack is detected in a processing-target object in the cutting step, immediately the condition of the cutting processing can be changed. Thus, the occurrence of failure of the device chip attributed to the crack can be suppressed to the minimum. The present invention is not limited to the description of the above embodiment and can be carried out with various changes. For example, when the crack detecting unit detects generation of a crack, the cutting apparatus may record the position of this crack in the processing-target object. Furthermore, the cutting apparatus may output information relating to this recorded position. If this information relating to the position is used, device chips located near the relevant crack can be treated as defective products when the device chips formed by dividing the processing-target object are picked up. Thus, a step of testing these device chips can be omitted.

Furthermore, in the above-described embodiment, the crack detecting unit is disposed on the rear side of the cutting blade. However, in addition to this crack detecting unit, similar crack detecting unit may be further disposed on the front side of the cutting blade. In general, the processing-target object is tested before being held by the cutting apparatus by suction and non-generation of a crack is checked. However, a crack is often generated in the processing-target object in the period after this test before execution of cutting processing. In such a case, when the crack detecting unit disposed on the front side of the cutting blade detects a crack, the extension of this crack can be prevented by changing the processing condition and the processing place as appropriate to keep the cutting blade from cutting into this crack. Furthermore, there is also the case in which, when cutting processing is carried out in a region about which the absence of a crack has been checked by the crack detecting unit disposed on the front side of the cutting blade, the crack detecting unit disposed on the rear side of the cutting blade detects a crack in this region. In this case, it can be confirmed that this crack has been generated due to the cutting processing.

Moreover, the crack detecting unit may be disposed at a position other than the position on the rear side or front side of the cutting blade. If the crack detecting unit is disposed on the rear side of the cutting blade, the crack detecting unit needs to be disposed distantly from the place at which cutting processing is being carried out depending on the size of the crack detecting unit or the size of the cutting blade. On the other hand, if the crack detecting unit is disposed at a position other than the position on the rear side or front side of the cutting blade, there is the case in which the crack detecting unit can be so disposed as to be brought closer to the place at which cutting processing is being carried out. In this case, a crack generated in the processing-target object 1 can be detected more rapidly. Furthermore, in the above-described embodiment, the crack detecting unit detects a crack by oscillating and observing ultrasonic waves. However, a crack may be detected by another method. For example, the crack detecting unit may detect a crack by using a laser beam or an X-ray or the like.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting method for cutting a processing-target object by a cutting blade, the cutting method comprising:
   a holding step of holding the processing-target object by a holding table; and
   a cutting step of cutting the processing-target object by the cutting blade by causing the cutting blade that rotates to cut into the processing-target object held by the holding table and causing the holding table and the cutting blade to relatively move after the holding step is carried out,
   wherein:
   in the cutting step, cutting is carried out with detection of whether or not a crack in the processing-target object exists by a crack detecting unit disposed on a rear side relative to the cutting blade in a cutting progression direction in which cutting processing of the processing-target object by the cutting blade progresses, and
   the cutting blade and the crack detecting unit are both supported by a blade unit, and further wherein said blade unit, with the cutting blade and the crack detecting unit supported thereon, and the holding table are moved relative to each other in the cutting progression direction during the cutting step.

2. The cutting method according to claim 1, wherein:
   relative movement between the holding table and the cutting blade is stopped or speed of the relative movement is decreased when a crack in the processing-target object is detected by the crack detecting unit in execution of the cutting step.

3. A cutting apparatus that cuts a processing-target object, the cutting apparatus comprising:
   a holding table that holds the processing-target object;
   cutting means having a cutting blade that cuts the processing-target object held by the holding table;
   moving means that causes the cutting blade and the holding table to relatively move; and
   a crack detecting unit that is disposed on a rear side relative to the cutting blade in a cutting progression direction in which cutting processing of the processing-target object by the cutting blade progresses, and detects whether or not a crack in the processing-target object exists, and
   wherein the cutting blade and the crack detecting unit are both supported by a blade unit, and further wherein said blade unit, with the cutting blade and the crack detecting unit supported thereon, and the holding table are moved relative to each other in the cutting progression direction during the cutting step.

4. The cutting method according to claim 1, wherein when a crack is detected by the crack detecting unit during execution of the cutting step, information related to the crack is transmitted to control equipment, whereby said control equipment decreases the cutting-feed rate or changes the rotational speed of the cutting blade.

5. The cutting apparatus according to claim 3, wherein when a crack is detected by the crack detecting unit during cutting processing, information related to the crack is transmitted to control equipment, whereby said control equipment decreases the cutting-feed rate or changes the rotational speed of the cutting blade.

6. The cutting method according to claim 1, wherein the blade unit is configured and arranged to be moved up and down in a Z-axis direction with respect to the holding table via a Z-axis movement mechanism.

7. The cutting apparatus according to claim 3, wherein the blade unit is configured and arranged to be moved up and down in a Z-axis direction with respect to the holding table via a Z-axis movement mechanism.

8. The cutting method according to claim 1, wherein when the crack detecting unit detects the generation of a crack, the position of the crack is recorded and device chips located near the position of the crack are considered as defective.

9. The cutting apparatus according to claim 3, wherein when the crack detecting unit detects the generation of a crack, the position of the crack is recorded and device chips located near the position of the crack are considered as defective.

10. The cutting method according to claim 1, wherein the crack detecting unit detects cracks by oscillating and observing ultrasonic waves.

11. The cutting apparatus according to claim 3, wherein the crack detecting unit detects cracks by oscillating and observing ultrasonic waves.

12. The cutting method according to claim 4, wherein said change in the rotational speed of the cutting blade comprises stopping the rotation of the cutting blade.

13. The cutting apparatus according to claim 5, wherein said change in the rotational speed of the cutting blade comprises stopping the rotation of the cutting blade.

* * * * *